United States Patent
He

(10) Patent No.: US 10,455,179 B2
(45) Date of Patent: Oct. 22, 2019

(54) ACTIVE PIXEL SENSOR WITH SENSING CIRCUITS AND OUTPUT CIRCUITS DISPOSED ON THE SAME SUBSTRATE

(71) Applicant: SILICON OPTRONICS, INC., Hsinchu (TW)

(72) Inventor: Xinping He, Hsinchu (TW)

(73) Assignee: SILICON OPTRONICS, INC., Hsinchu (TW)

( * ) Notice: Subject to any disclaimer, the term of this patent is extended or adjusted under 35 U.S.C. 154(b) by 0 days.

(21) Appl. No.: 15/683,082

(22) Filed: Aug. 22, 2017

(65) Prior Publication Data

US 2019/0007640 A1  Jan. 3, 2019

(30) Foreign Application Priority Data

Jun. 30, 2017 (TW) .............................. 106121977 A

(51) Int. Cl.
*H04N 3/14* (2006.01)
*H04N 5/335* (2011.01)
*H04N 5/3745* (2011.01)
*H04N 5/378* (2011.01)
*H01L 27/146* (2006.01)

(52) U.S. Cl.
CPC ..... *H04N 5/3745* (2013.01); *H01L 27/14612* (2013.01); *H01L 27/14636* (2013.01); *H01L 27/14643* (2013.01); *H04N 5/378* (2013.01); *H04N 5/37457* (2013.01)

(58) Field of Classification Search
CPC .................. H04N 5/3745; H04N 5/378; H01L 27/14643; H01L 27/14609; H01L 27/14612

USPC .................................................. 348/308–310
See application file for complete search history.

(56) References Cited

U.S. PATENT DOCUMENTS

| | | | | |
|---|---|---|---|---|
| 5,841,126 A | * | 11/1998 | Fossum | G11C 19/282 250/208.1 |
| 7,428,103 B2 | * | 9/2008 | Boettiger | B29D 11/00278 257/E27.131 |
| 7,471,324 B2 | * | 12/2008 | Tu | H04N 3/1568 250/208.1 |
| 8,514,310 B2 | * | 8/2013 | Ang | H04N 5/378 348/294 |

(Continued)

FOREIGN PATENT DOCUMENTS

CN 101268682 B 5/2012
TW 201347161 A 11/2013

*Primary Examiner* — Ngoc Yen T Vu
(74) *Attorney, Agent, or Firm* — Muncy, Geissler, Olds & Lowe, P.C.

(57) ABSTRACT

An active pixel sensor is provided. The active pixel sensor includes a substrate, a plurality of sensing circuits, and a plurality of output circuits. The substrate is divided into a plurality of pixel rows. A plurality of pixel areas are disposed on the plurality of pixel rows. The plurality of sensing circuits are disposed in the pixel areas on the pixel rows excluding a specific pixel row among the plurality of pixel rows. The plurality of sensing circuits are further disposed on a plurality of pixel columns to form an array. Each of the plurality of sensing circuits includes a sensing element, a transfer transistor, and a floating diffusion node. The plurality of output circuits are disposed in the pixel areas on the specific pixel row. The sensing circuits on the same pixel column are coupled to the same output circuit.

14 Claims, 7 Drawing Sheets

(56) References Cited

U.S. PATENT DOCUMENTS

| | | | |
|---|---|---|---|
| 9,210,347 B2 * | 12/2015 | Yin | H01L 27/14609 |
| 9,967,492 B2 * | 5/2018 | Kobayashi | H04N 5/37455 |
| 2013/0033632 A1 * | 2/2013 | Kishi | H01L 27/14634 |
| | | | 348/308 |

* cited by examiner

ACTIVE PIXEL SENSOR WITH SENSING CIRCUITS AND OUTPUT CIRCUITS DISPOSED ON THE SAME SUBSTRATE

CROSS REFERENCE TO RELATED APPLICATIONS

This Application claims priority of Taiwan Patent Application No. 106121977, filed on Jun. 30, 2017, the entirety of which is incorporated by reference herein.

BACKGROUND OF THE INVENTION

Field of the Invention

The invention relates to an active pixel sensor, and more particularly, to an active pixel sensor which comprises more sensing pixels and has better transmittence.

Description of the Related Art

Complementary metal oxide semiconductor (CMOS) image sensors have been widely used in a variety of applications, such as digital cameras and deoxyribonucleic acid (DNA) sensors, for example. Generally, each pixel on a sensing panel of a CMOS image sensor comprises a sensing element and other elements generating a corresponding sensing signal. As the size of the CMOS image sensor gets smaller, the size of the sensing element in each pixel must be reduced (that is, the fill rate is reduced). Moreover, the sensing panel is converted with metal wires which are connected with the pixels. These metal wires disadvantageously affect the light transmission of the sensing panel, which causes a dispersion phenomenon. Thus, the amount of light sensed by each pixel is reduced, which degrades the sensing accuracy of the CMOS image sensor.

BRIEF SUMMARY OF THE INVENTION

One exemplary embodiment of an active pixel sensor is provided. The active pixel sensor comprises a substrate, a plurality of sensing circuits, and a plurality of output circuits. The substrate is divided into a plurality of pixel rows. A plurality of pixel areas are disposed on the plurality of pixel rows. The plurality of sensing circuits are disposed in the pixel areas on the pixel rows excluding a specific pixel row among the plurality of pixel rows. The plurality of sensing circuits are further disposed on a plurality of pixel columns to form an array. Each of the plurality of sensing circuits comprises a sensing element, a transfer transistor, and a floating diffusion node. The plurality of output circuits are disposed in the pixel areas on the specific pixel row. The sensing circuits on the same pixel column are coupled to the same output circuit.

Another exemplary embodiment of an active pixel sensor is provided. The active pixel sensor comprises a substrate, a plurality of sensing circuits, and a plurality of output circuits. The substrate comprises a plurality of pixel areas which are disposed on a plurality of columns and a plurality rows to form an array. The plurality of sensing circuits are disposed in the pixel areas on the pixel rows excluding a specific pixel row among the plurality of pixel rows. Each of the plurality of sensing circuits comprises a sensing element, a transfer transistor, and a floating diffusion node. The plurality of output circuits are disposed in the pixel areas on the specific pixel row. The sensing circuits on the same pixel column are coupled to the same output circuit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
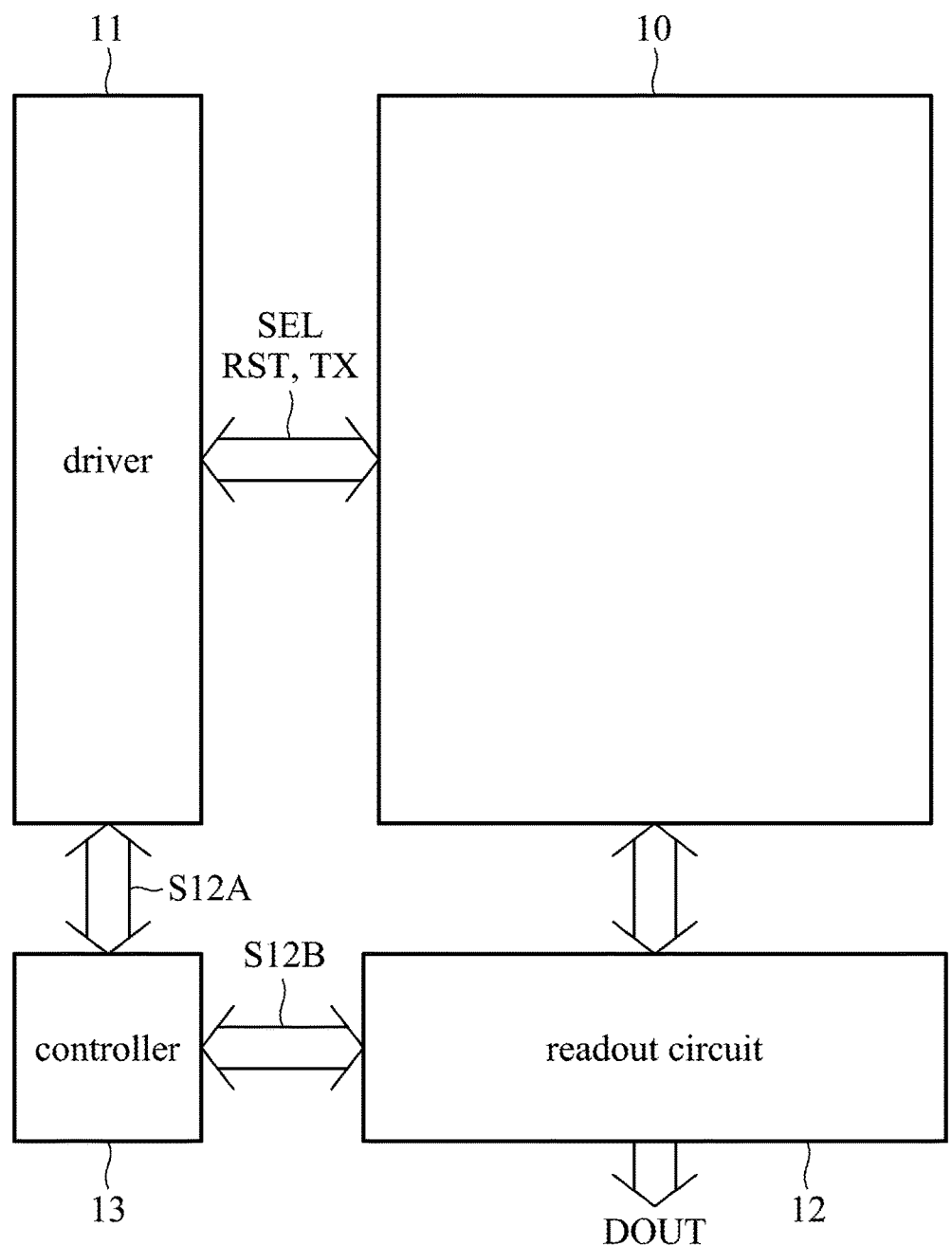
FIG. 1 shows an exemplary embodiment of an active pixel sensor.

FIG. 1 shows an exemplary embodiment of an active pixel sensor. As shown in FIG. 1, an active pixel sensor 1 comprises a pixel substrate 10, a driver 11, a readout circuit, and a controller 13. There are a plurality of sensing circuits and a plurality of output circuits on the pixel substrate 10. The driver 11 generates various signals to control the sensing circuits and the output circuit on the pixel substrate 10 to perform an image sensing operation. The signals generated by the driver 11 comprise reset signals RST, scan signals TX, and selection signals SEL which are applied to control the sensing circuits. The readout circuit 12 receives the signals from the output circuits on the pixel substrate 10 to generate image data DOUT representing the image sensed by the sensing circuits. The controller 13 generates at least one timing control signal S12A to the driver 11. The controller 12 further generates various control signals S13B to control the readout circuit 12. The active pixel sensor provided in the embodiment can be a deoxyribonucleic acid (DNA) sensor.

Figure 2A:
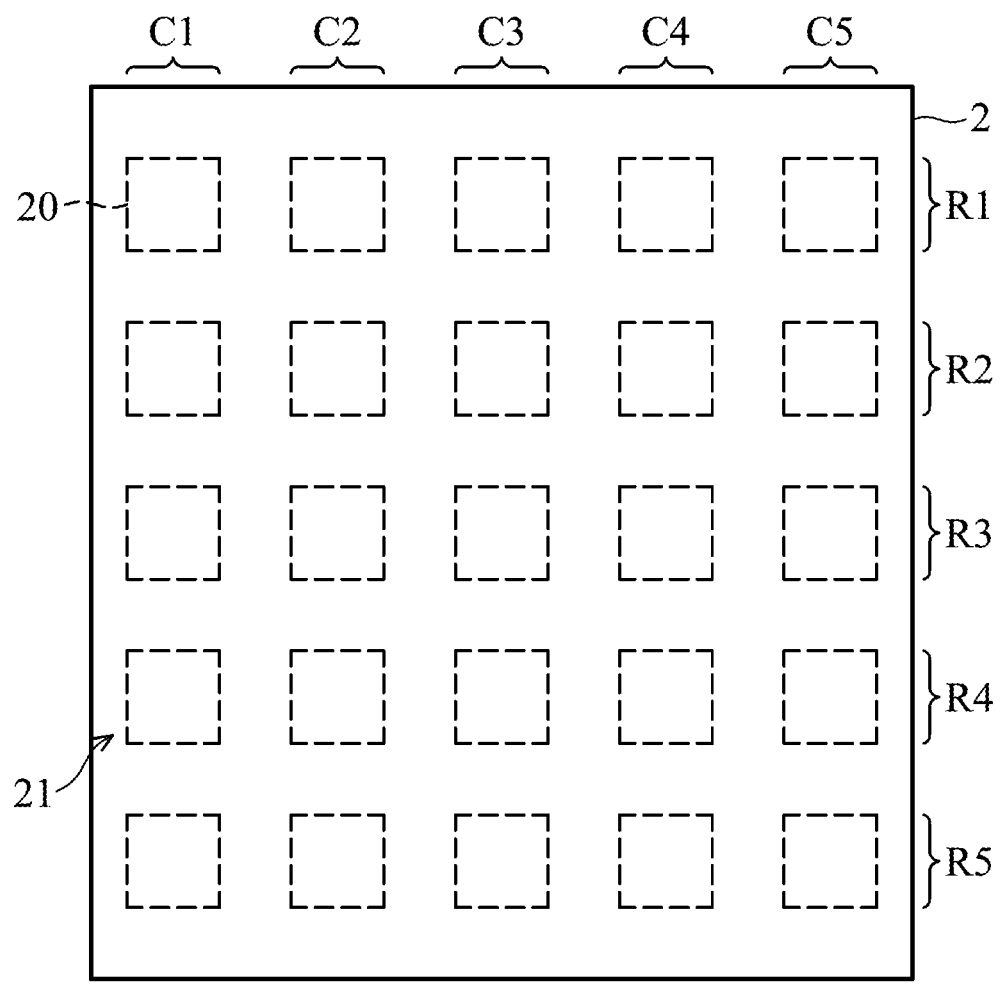
FIG. 2A shows one exemplary embodiment of a pixel substrate.

FIG. 2A shows one exemplary embodiment of a pixel substrate. Referring to FIG. 2A, the pixel substrate 2 is provided to serve as the pixel substrate 10 of FIG. 1. The pixel substrate 2 comprises a plurality of pixel areas 20. The pixel areas 20 are disposed on a plurality of pixel columns and a plurality of pixel rows to form an array 21. In the embodiment of FIG. 2A, twenty-five pixel areas 20 disposed on five pixel columns C1~C5 and five pixel rows R1~R5 are given as an example for illustration. In other embodiments, the number of pixel areas, the number of pixel columns, and the number of pixel rows can be determined according to the system requirements. The invention should not be limited in the above example. The pixel areas are shown in FIG. 2A by exemplary shape, however, without limitation to the invention. The sensing circuits SC and the output circuits OC of the pixel sensor 1 are disposed in the pixel areas of the pixel substrate 2. In order to clearly describe the disposition of the pixel areas, the reference sign "20" is followed by a corresponding reference sign "(CX,RY)" which indicates the pixel column and the pixel row where a corresponding pixel area is disposed in the later paragraphs. In the embodiment, each of X and Y is one positive integer in a range of 1 to 5.

Figure 2B:
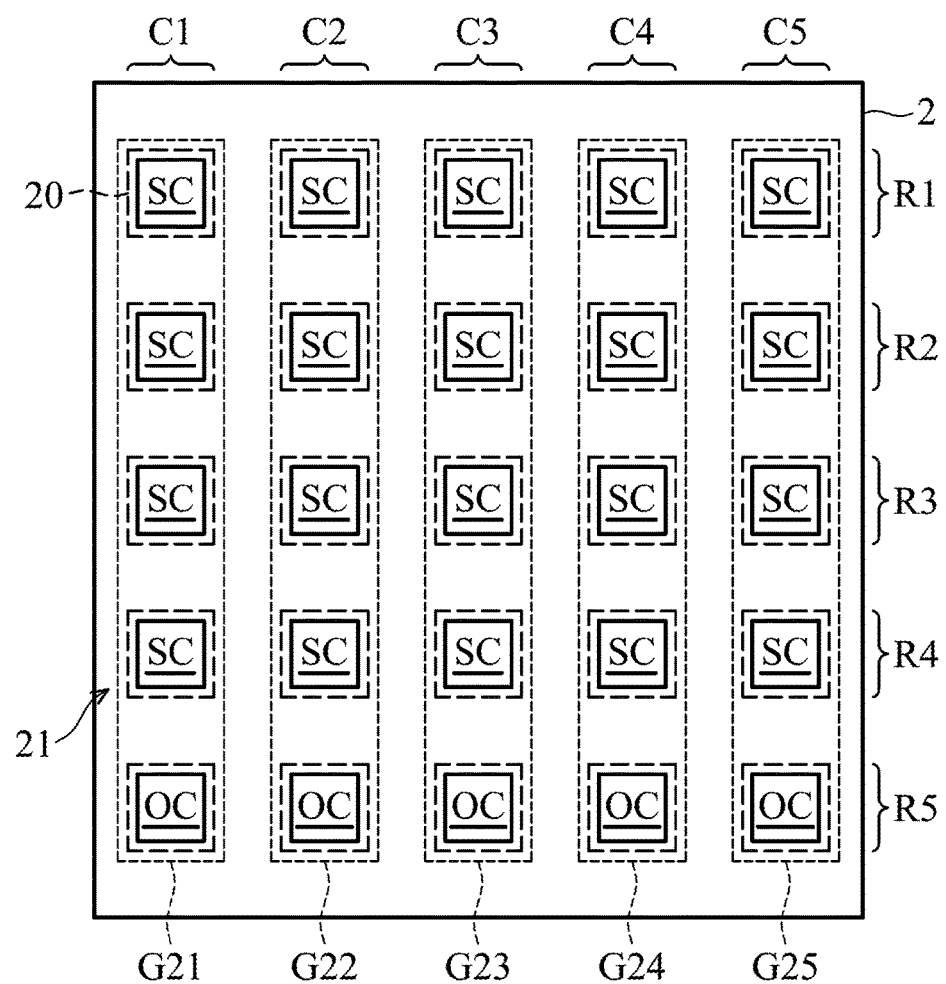
FIG. 2B is a schematic view showing disposition of sensing circuits and output circuits on the pixel substrate of FIG. 2A according to one exemplary embodiment.

FIG. 2B is a schematic view showing disposition of the sensing circuits SC and the output circuits OC according to one exemplary embodiment. Referring to FIG. 4B, the sensing circuits SC are disposed on the pixel rows excluding a specific pixel row. For example, the specific pixel row is the last pixel row R5 among the pixel rows R1~R5. In another embodiment, the specific pixel row is the first pixel row R1 among the pixel rows R1~R5 or any one of the pixel rows R2~R4. The sensing circuits SC are disposed in the pixel areas 20(C1,R1)~20(C5,R4) on the rows R1~R4. In the embodiment, the sensing circuits SC on one pixel column share one output circuit OC which is also disposed on the same pixel column. Since the pixel substrate 2 comprises five pixel columns C1~C5, there are five output circuits OC disposed in the pixel areas 20(C1,R5)~20(C5, R5) on the pixel row R5 respectively. For example, the sensing circuits SC respectively disposed on the four pixel areas 20(C1,R1)~20(C1,R4) on the pixel column C1 share the output circuit OC disposed in the pixel area 20(C1,R5) on the pixel column C1. According to the disposition shown in FIG. 2B, the pixel areas 20(C1,R1)~20(C5,R5) are divided into five groups G21~G25 by taking one pixel column as an unit for the division, and each group comprises the pixel areas where four sensing circuits SC are disposed and the pixel area where one output circuit OC is disposed. The four sensing circuits SC in one group share the output circuit OC in the same group. Since the pixel areas 20 are disposed to form the array 21, all the sensing circuits SC and all the output circuits OC are disposed to form an array corresponding to the array 21. In later paragraphs, the structures of the sensing circuits SC and the shared output circuit OC disposed on the same column will be described by taking the groups G21 corresponding to the pixel column C1 and the pixel rows R1~R5 as an example. In order to clearly show the pixel areas where the sensing circuits SC and the output circuits OC, there are some pixel areas are labeled by reference signs in FIG. 3, such as the pixel areas 20(C1,R1), 20(C1, R2), and 20(C1,R5).

Figure 3:
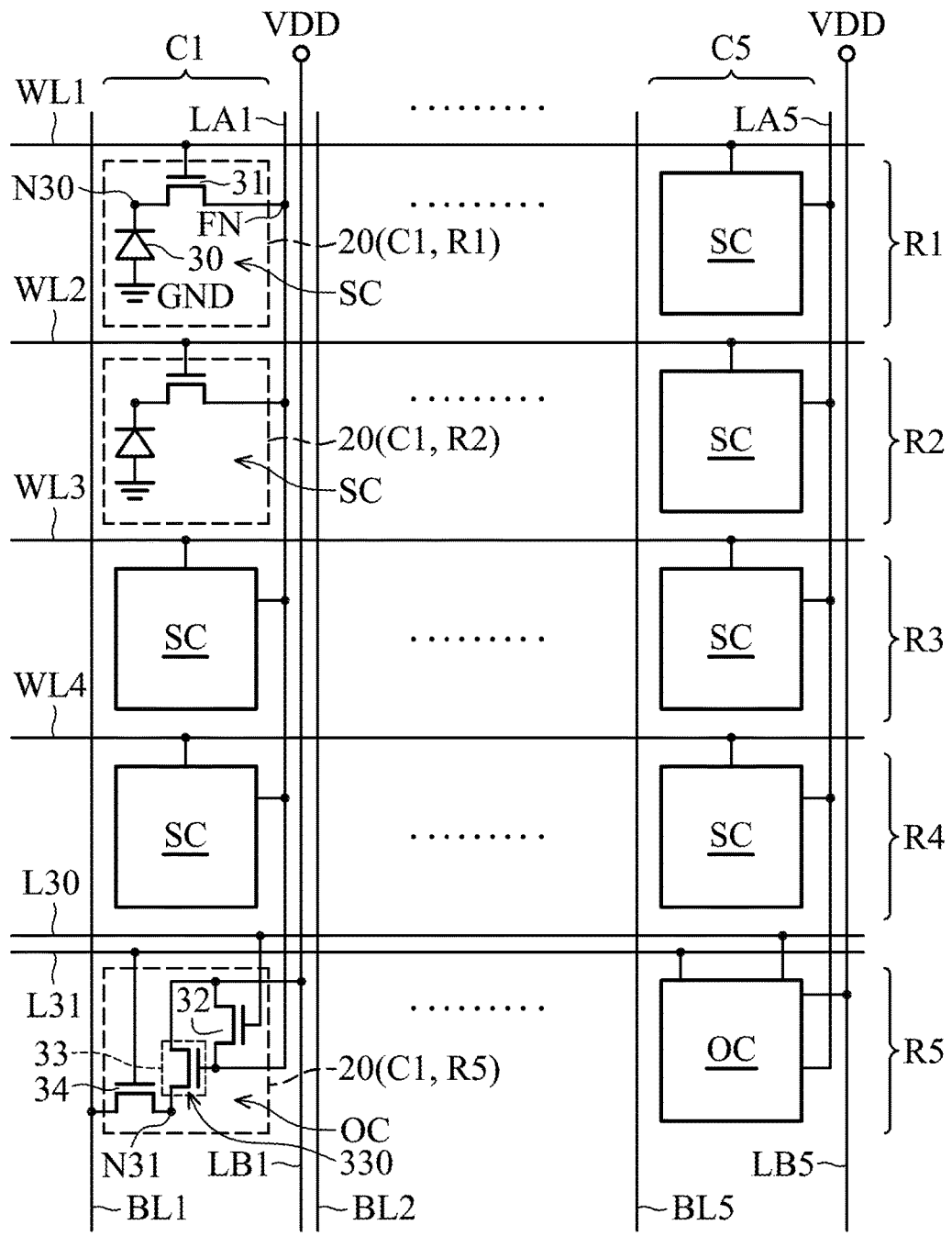
FIG. 3 is a schematic view showing structures of the sensing circuit and the output circuit of FIG. 2B according to one exemplary embodiment.

Referring to FIG. 3, the pixel substrate 2 further comprises a plurality of word lines WL1~WL4 and a plurality of bit lines BL1~BL5. The word lines WL1~WL4 correspond to the pixel rows R1~R4 respectively, while the bit lines BL1~BL5 correspond to the pixel columns C1~C5 respectively. The sensing circuits SC disposed on the same pixel column are coupled to the same bit line, while the sensing circuits SC disposed on the same pixel row are coupled to the same word line. Each sensing circuit SC comprises a sensing element 30 and a transfer transistor 31. The sensing element 30 is implemented by a photoelectric diode. The anode of the photoelectric diode is coupled to the ground GND, and the cathode thereof is coupled to the node N30. The gate (the control terminal) of the transfer transistor 31 is coupled to the word line WL1 to receive a scan signal TX from the driver 11, the drain (the first terminal) thereof is coupled to the cathode of the photoelectric diode at the node N30, and the source (the second terminal) thereof is coupled to a floating diffusion node FN. The floating diffusion node FN is coupled to the connection line LA1. The output circuit OC is coupled to the floating diffusion node FN of the sensing circuits SC disposed on the same pixel column C1 through the connection line LA1. The output circuit OC comprises a reset transistor 32, a source follower 33, and a selection transistor 34. In the embodiment, the source follower 33 comprises an output transistor 330. In the embodiment of FIG. 3, for example, the transistors 31, 32, 34, and 330 are implemented by N-type metal-oxide semiconductor (NMOS) transistors. The gate of the reset transistor 32 is coupled to a line L30 to receive the reset signal RST from the driver 11, the drain thereof is coupled to a power line LB1 to receive a supply voltage VDD, and the source thereof is coupled to the connection line LA1. The gate of the output transistor 330 is coupled to the connection line LA1, the drain thereof is coupled to the power line LB1 to receive the supply voltage VDD, and a source thereof is coupled to a node N31. The gate of the selection transistor 34 is coupled to a line L31 to receive the selection signal SEL, the drain thereof is coupled to the node N31, and the source thereof is coupled to the corresponding bit line BL1.

The other groups G22~G25 have the same structure of the group G21, and the related description is omitted. According to the above description, the pixel areas 20 on the pixel substrate 2 are disposed on a plurality of pixel columns and a plurality of rows. The pixel areas on one row are the areas where the output circuits OC are disposed, and the pixel areas on the other rows are the areas where the sensing circuits SC are disposed. The sensing circuits SC disposed on the same column share one output circuit OC through a connection line. According to the embodiment, one pixel row of the pixel substrate 2 is specified for the output circuits OC, and several sensing circuits SC share one output circuit. Thus, the metal wires on the pixel substrate 2 can be reduced, thereby increasing the optical transmission of the sensor. In conventional active pixel sensors, there is one output circuit in each sensing pixel, and there are two horizontal lines used to transmit a reset signal and a selection signal for the output circuits in the sensing pixels on the same row. According to the embodiment, the output circuits OC are disposed on a specific pixel row, and thus, for the pixel substrate 2, there are only two horizontal lines L30 and L31 for the output circuits OC on the specific pixel row. Compared with the conventional active pixel sensors, the number of horizontal lines on the pixel substrate 2 is less.

Figure 4A:
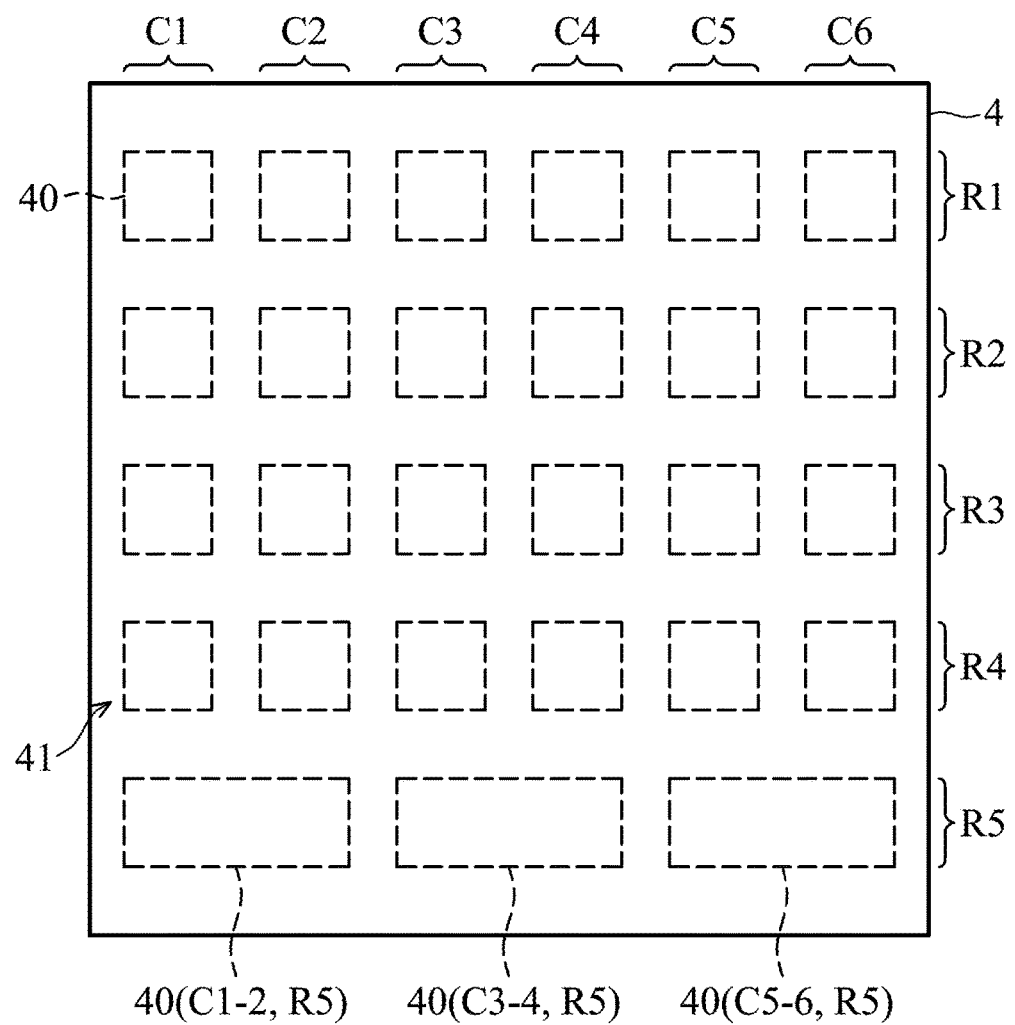
FIG. 4A shows another exemplary embodiment of a pixel substrate.
Figure 4B:
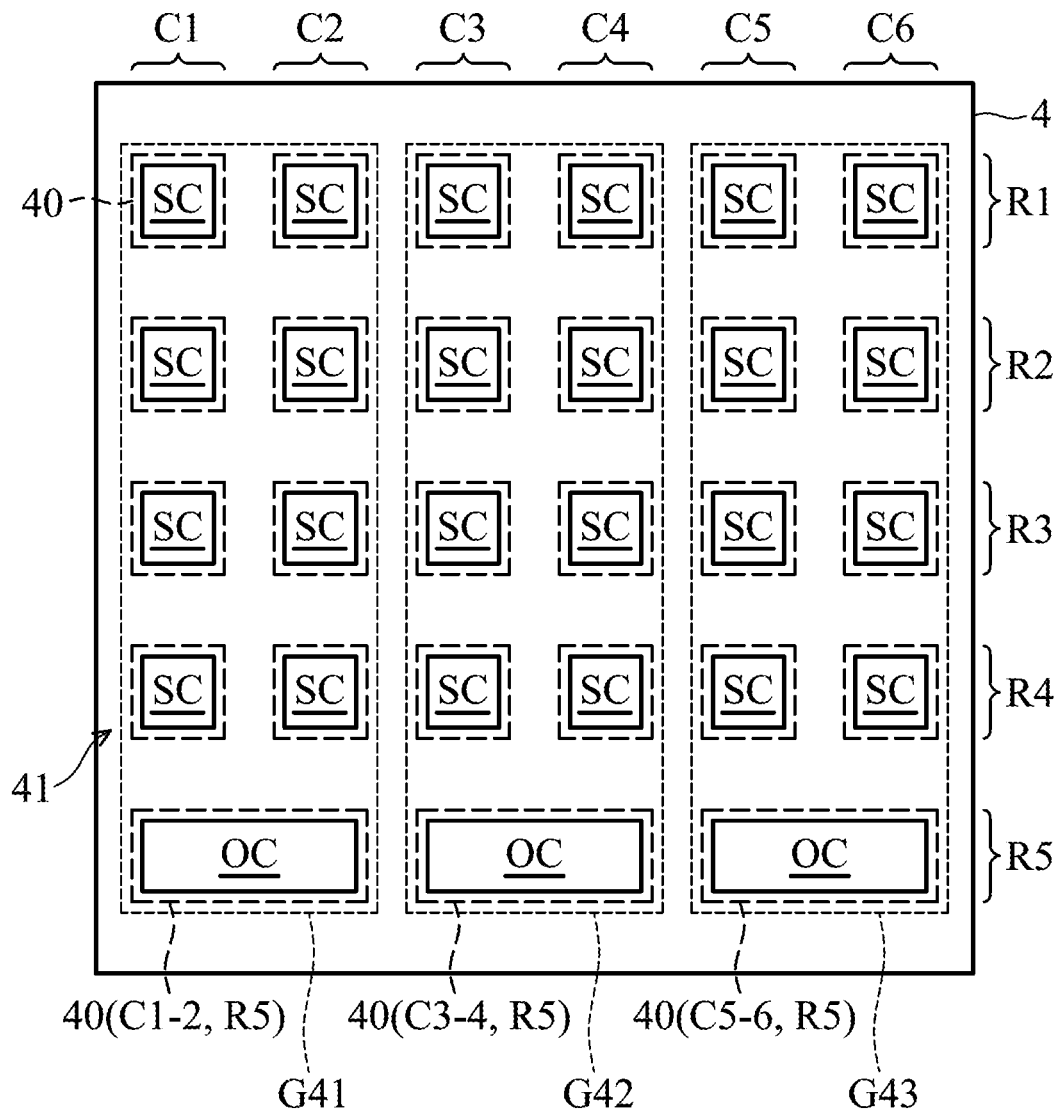
FIG. 4B is a schematic view showing disposition of sensing circuits and output circuits on the pixel substrate of FIG. 4A according to another exemplary embodiment.

FIG. 4A shows another exemplary embodiment of a pixel substrate. Referring to FIG. 4A, the pixel substrate 4 is provided to serve as the pixel substrate 10 of FIG. 1. The pixel substrate 4 comprises a plurality of pixel areas 40. The pixel areas 40 are disposed on a plurality of pixel rows. In the embodiment of FIG. 4A, pixel areas 40 disposed on five pixel rows R1~R5 are given as an example for illustration. Moreover, the pixel areas 40 on the pixel rows R1~R5 are also disposed on pixel columns C1~C6 for form an array 41. In order to clearly describe the disposition of the pixel areas on the pixel rows R1~R4 and the pixel columns C1~C6, the reference sign "40" is followed by reference sign "(CX,RY)" which indicates the pixel column and the pixel row where a corresponding pixel area is disposed in the array 41 in the following description. In the embodiment, X is one positive integer in a range of 1 to 6, and Y is one positive integer in a range of 1 to 4. Referring to FIG. 4A, on the pixel row R5, each pixel area corresponds to two pixel columns. In order to clearly describe the disposition of the pixel areas 40 on the pixel row R5, the reference sign "40" is followed by reference sign "(CM-(M−1),R5)" which indicates the pixel column and the pixel row where a corresponding pixel area is disposed in the array 41 in the following description and the related drawings, wherein "CM-(M+1)" represents two corresponding pixel columns, and M is equal to 1, 3, or 5.

In detail, the pixel area 40(C1-2,R5) corresponds to the pixel columns C1 and C2, the pixel area 40(C3-4,R5) corresponds to the pixel columns C3 and C4, and the pixel area 40(C5-6,R5) corresponds to the pixel columns C5 and C6. In other embodiments, the number of pixel areas, the number of pixel columns, and the number of pixel rows can be determined according to the system requirements. The invention should not be limited in the above example. The pixel areas are represented by exemplary shape in FIG. 4A, however, without limitation to the invention. The sensing circuits SC and the output circuits OC of the pixel sensor 1 are disposed in the pixel areas 40 of the pixel substrate 4.

FIG. 4B is a schematic view showing disposition of the sensing circuits SC and the output circuits OC according to one exemplary embodiment. Referring to FIG. 4B, the sensing circuits SC are disposed on the pixel rows excluding a specific pixel row. For example, the specific pixel row is the last pixel row R5 among the pixel rows R1~R5. In another embodiment, the specific pixel row is the first pixel row R1 among the pixel rows R1~R5 or any one of the pixel rows R2~R4. The sensing circuits SC are disposed in the pixel areas 40(C1,R1)~20(C6,R4) on the rows R1~R4. Since the sensing circuits SC are disposed on the pixel rows R1~R4 of the array 41, the disposition of the sensing circuits SC is also an array corresponding to the array 41. In the embodiment, the sensing circuits SC on the same pixel column share one output circuit OC, and, particularly, the sensing circuits SC on one set of adjacent pixel columns share one output circuit OC. Since the pixel substrate 4 comprises six pixel columns C1~C6, there are three output circuits OC disposed in the pixel areas 40(C1-2,R5), 40(C3-4,R5), and 40(C5-6,R5) on the pixel row R5 respectively. For example, the sensing circuits SC respectively disposed on the four pixel areas 40(C1,R1)~40(C1,R4) on the pixel column C1 and the sensing circuits SC respectively disposed on the four pixel areas 40(C2,R1)~40(C2,R4) on the pixel column C2 share the output circuit OC disposed in the pixel area 40(C1-2,R5) on the pixel column C1. According to the disposition shown in FIG. 4B, the pixel areas 40(C1,R1)~20(C6,R4), 40(C1-2,R5), 40(C3-4,R5), and 40(C5-6,R5) are divided into three groups G41~G43 by taking two pixel columns as an unit for the division, and each group comprises the pixel areas where eight sensing circuits SC are disposed and the pixel area where one output circuit OC is disposed. The eight sensing circuits SC in one group share the output circuit OC in the same group. In other words, all the sensing circuits SC on two pixel columns share one output circuit OC. In later paragraphs, the structures of the sensing circuits SC and the shared output circuit OC disposed on the same column will be described by taking the groups G41 corresponding to the pixel columns C1~C2 and the pixel rows R1~R5 as an example.

Figure 5:
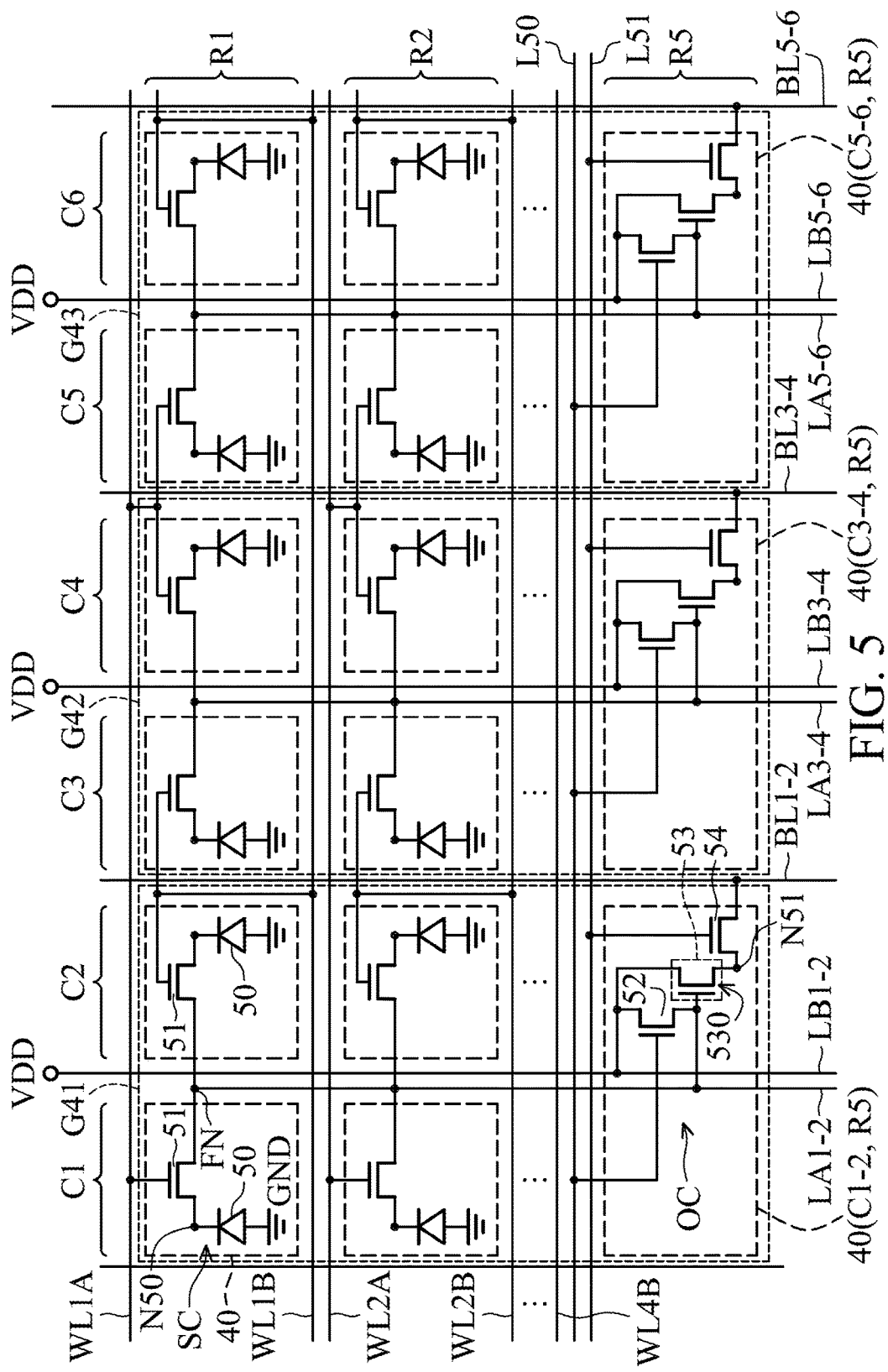
FIG. 5 is a schematic view showing structures of the sensing circuit and the output circuit of FIG. 4B according to another exemplary embodiment.

Referring to FIG. 5, the pixel substrate 4 further comprises a plurality of word lines WLA1~WLA4 and WLB1~WLB4 and a plurality of bit lines BL1-2~BL5-6. Each bit line is coupled to all the sensing circuits SC in the corresponding group. In other words, all the sensing circuits SC on two pixel columns share one bit line. As shown in FIG. 5, all the sensing circuits SC in the group G41 are coupled to the bit line BL1-2, that is, all the sensing circuits SC on the pixel columns C1 and C2 share the bit line BL1-2. Each sensing circuit SC comprises a sensing element 50 and a transfer transistor 51. The sensing element 50 is implemented by a photoelectric diode. The anode of the photoelectric diode is coupled to the ground GND, and the cathode thereof is coupled to the node N50. The drain of the transfer transistor 51 thereof is coupled to the cathode of the photoelectric diode at the node N50, and the source thereof is coupled to a floating diffusion node FN. The floating diffusion node FN is coupled to the connection line LA1-2. Referring to FIG. 5, it should be noted that the gate of the transfer transistor 51 of the sensing circuit SC on the pixel column C1 and the pixel row R1 is coupled to one word line WLA1 to receive a scan signal TX from the driver 11, while the gate of the transfer transistor 51 of the sensing circuit SC on the pixel column C2 and the pixel row R1 is coupled to another word line WLB1 to receive another scan signal TX from the driver 11, Thus, in the same group, the gates of the transfer transistors 51 of the sensing circuits SC on the same row are coupled to different word lines. The output circuit OC corresponding to the pixel columns C1 and C2 is coupled to the floating diffusion nodes FN of the sensing circuits SC disposed on the pixel columns C1 and C2 through the connection line LA1-2. The output circuit OC comprises a reset transistor 52, a source follower 53, and a selection transistor 54. In the embodiment, the source follower 53 comprises an output transistor 530. In the embodiment of FIG. 5, for example, the transistors 51, 52, 54, and 530 are implemented by NMOS transistors. The gate of the reset transistor 52 is coupled to a line L50 to receive the reset signal RST from the driver 11, the drain thereof is coupled to a power line LB1-2 to receive a supply voltage VDD, and the source thereof is coupled to the connection line LA1-2. The gate of the output transistor 530 is coupled to the connection line LA1-2, the drain thereof is coupled to the power line LB1-2 to receive the supply voltage VDD, and a source thereof is coupled to a node N51. The gate of the selection transistor 54 is coupled to a line L51 to receive the selection signal SEL, the drain thereof is coupled to the node N51, and the source thereof is coupled to the corresponding bit line BL1-2.

The other groups G42~G43 have the same structure of the group G41, and the related description is omitted. According to the above description, in the same group, the gates of the transfer transistors 51 of the sensing circuits SC on the same row are coupled to different word lines. Accordingly, in one group, the transfer transistors 51 of the sensing circuits on the same pixel row are turned on at different times by receiving different scan signals through the different word lines. Referring to FIG. 5, according to the above connection relationship between the sensing circuits and the word lines, for one pixel row, the gates of the transfer transistors 51 of the sensing circuits SC which belong to the groups G41, G42, and G3 and further are disposed on the pixel columns C1, C3, and C5, respectively, are coupled to one word line, while the gates of the transfer transistors 51 of the sensing circuits SC which belong to the groups G41, G42, and G3 and further are disposed on the pixel columns C2, C4, and C6, respectively, are coupled to another word line. For example, on the pixel row R1, the gates of the transfer transistors 51 of the sensing circuits SC respectively disposed on the pixel columns C1, C3, and C5 are coupled to the word line WLA1, while the gates of the transfer transistors 51 of the sensing circuits SC respectively disposed on the pixel columns C2, C4, and C6, respectively, are coupled to the word line WLB1.

According to the above description, the pixel areas 40 on the pixel substrate 4 are disposed on a plurality of pixel columns and a plurality of rows. The pixel areas on one row are the areas where the output circuits OC are disposed, and the pixel areas on the other rows are the areas where the sensing circuits SC are disposed. The sensing circuits SC disposed on the two adjacent columns share one output circuit OC through a connection line. According to the embodiment, one pixel row of the pixel substrate 4 is specified for the output circuits OC, and several sensing circuits SC share one output circuit. Thus, the metal wires on the pixel substrate 4 can be reduced, thereby increasing the optical transmission of the sensor. In conventional active pixel sensors, there is one output circuit in each sensing pixel, and there are two horizontal lines used to transmit a reset signal and a selection signal for the output circuits in the sensing pixels on the same row. According to the embodiment, the output circuits OC are disposed on a specific pixel row, and thus, for the pixel substrate 4, there are only two horizontal lines L50 and L51 for the output circuits OC on the specific pixel row. Compared with the conventional active pixel sensors, the number of horizontal lines on the pixel substrate 4 is less.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An active pixel sensor comprising:
a substrate divided into a plurality of pixel rows, wherein a plurality of pixel areas are disposed on the plurality of pixel rows;
a plurality of sensing circuits disposed in the pixel areas on the pixel rows excluding a specific pixel row among the plurality of pixel rows, wherein the plurality of sensing circuits are further disposed on a plurality of pixel columns to form an array, and each of the plurality of sensing circuits comprises a sensing element, a transfer transistor, and a floating diffusion node; and
a plurality of output circuits disposed in the pixel areas on the specific pixel row,
wherein the sensing circuits on the same pixel column are coupled to the same output circuit,
wherein the sensing circuits on the same pixel column are coupled to the same output circuit through a connection line, and
wherein in each sensing circuit, a first terminal of the sensing element is coupled to a ground, and a second terminal of the sensing element is coupled to a first node, a first terminal of the transfer transistor is coupled to the first node, a control terminal of the transfer transistor receives a scan signal, a second terminal of the transfer transistor is coupled to the floating diffusion node, and the floating diffusion node is coupled to the corresponding connection line.

2. The active pixel sensor as claimed in claim 1, wherein the sensing circuits on the adjacent pixel columns of a predetermined number are coupled to the same output circuit.

3. The active pixel sensor as claimed in claim 2, wherein the sensing circuits on the adjacent pixel columns with the predetermined number are coupled to the same output circuit through a connection line.

4. The active pixel sensor as claimed in claim 1, wherein the specific pixel row is the first or last one among the plurality of pixel rows.

5. The active pixel sensor as claimed in claim 1, the specific pixel row is disposed between any two of the other pixel rows.

6. The active pixel sensor claimed in claim 1, wherein each output circuit is coupled to the corresponding connection line and a corresponding bit line, and each output circuit comprises:
a reset transistor having a control terminal receiving a reset signal, a first terminal receiving a supply voltage, and a second terminal coupled to the corresponding connection line;
a source follower having a control terminal coupled to the corresponding connection line, a first terminal receiving the supply voltage, and a second terminal coupled to a second node; and
a selection transistor controlled by a selection signal and coupled between the second node and the corresponding bit line.

7. The active pixel sensor as claimed in claim 1, wherein when the sensing circuits on two adjacent pixel columns among the plurality of pixel columns are coupled to the same output circuit, the control terminals of the transfer transistors of the sensing circuits on the two adjacent pixel columns and on the same pixel row receive the corresponding scan signals through different word lines respectively.

8. The active pixel sensor as claimed in claim 1, wherein when the sensing circuits on two adjacent pixel columns among the plurality of pixel columns are coupled to the same output circuit, the sensing circuits on the two adjacent pixel columns are coupled to the same connection line.

9. The active pixel sensor as claimed in claim 1, wherein the floating diffusion nodes of the sensing circuits on the same pixel column are coupled to the same output circuit through one connection line.

10. An active pixel sensor comprising:
a substrate comprising a plurality of pixel areas which are disposed on a plurality of pixel columns and a plurality of pixel rows to form an array;
a plurality of sensing circuits disposed in the pixel areas on the pixel rows excluding a specific pixel row among the plurality of pixel rows, wherein each of the plurality of sensing circuits comprises a sensing element, a transfer transistor, and a floating diffusion node; and
a plurality of output circuits disposed in the pixel areas on the specific pixel row,
wherein the sensing circuits on the same pixel column are coupled to the same output circuit,
wherein the sensing circuits on the same pixel column are coupled to the same output circuit through a connection line, and
wherein in each sensing circuit, a first terminal of the sensing element is coupled to a ground, and a second terminal of the sensing element is coupled to a first node, a first terminal of the transfer transistor is coupled to the first node, a control terminal of the transfer transistor receives a scan signal, a second terminal of the transfer transistor is coupled to the floating diffusion node, and the floating diffusion node is coupled to the corresponding connection line.

11. The active pixel sensor as claimed in claim 10, wherein the specific pixel row is the first or last one among the plurality of pixel rows.

12. The active pixel sensor as claimed in claim 10, wherein the specific pixel row is disposed between any two of the other pixel rows.

13. The active pixel sensor claimed in claim 10, wherein each output circuit is coupled to the corresponding connection line and a corresponding bit line, and each output circuit comprises:

a reset transistor having a control terminal receiving a reset signal, a first terminal receiving a supply voltage, and a second terminal coupled to the corresponding connection line;

a source follower having a control terminal coupled to the corresponding connection line, a first terminal receiving the supply voltage, and a second terminal coupled to a second node; and a selection transistor controlled by a selection signal and coupled between the second node and the corresponding bit line.

14. The active pixel sensor as claimed in claim 10, wherein the floating diffusion nodes of the sensing circuits on the same pixel column are coupled to the same output circuit through one connection line.

* * * * *